United States Patent [19]

Hodgson et al.

[11] 4,329,534

[45] May 11, 1982

[54] UNIFORM INCIDENT LIGHT HIGH VOLTAGE SOLAR CELL ARRAY

[75] Inventors: Rodney T. Hodgson, Ossining; Harold J. Hovel, Katonah, both of N.Y.

[73] Assignee: International Business Machines Corporation, Armonk, N.Y.

[21] Appl. No.: 234,298

[22] Filed: Feb. 17, 1981

Related U.S. Application Data

[63] Continuation of Ser. No. 107,947, Dec. 28, 1979, abandoned.

[51] Int. Cl.³ ............................................. H01L 31/04
[52] U.S. Cl. .................................................... 136/247
[58] Field of Search .......................................... 136/247

[56] References Cited

U.S. PATENT DOCUMENTS

| | | | |
|---|---|---|---|
| 4,164,432 | 8/1979 | Boling | 136/247 |
| 4,188,238 | 2/1980 | Boling | 136/247 |
| 4,251,284 | 2/1981 | Oster, Jr. | 136/247 |

*Primary Examiner*—Aaron Weisstuch
*Attorney, Agent, or Firm*—Alvin J. Riddles

[57] ABSTRACT

A fluorescent material member covering a series array of solar cells that produce a high voltage operates to convert incident light to a uniform number of photons per cell.

4 Claims, 4 Drawing Figures

UNIFORM INCIDENT LIGHT HIGH VOLTAGE SOLAR CELL ARRAY

This is a continuation of application Ser. No. 107,947 filed Dec. 28, 1979, now abandoned.

DESCRIPTION

Technical Field

The technical field of the invention is the conversion of solar energy into electric current.

Individual solar cells each generate a voltage that is only on the order of the energy gap of the semiconductor involved. In order to obtain higher voltages it has been necessary to use a plurality of solar cells in series so that the voltage at the output of the array is the sum of the voltage increments of the various cells. A problem has existed heretofore in this type construction in that the overall array of cells when connected in series to produce the high voltage can deliver only the current that the weakest cell in the array produces. In applications where there is a variation of light intensity over the surface of the series array, therefore, a limitation has been present in that the amount of current that can be delivered from the entire array will not exceed that produced by the individual cell with the least light striking it.

Background Art

It has been known in the art, particularly as is shown in U.S. Pat. Nos. 3,484,606 and 3,714,119, that fluorescent materials when used as a cover or an intermediate member will convert some of the wavelengths of incident light to wavelengths that will be more closely tuned to the energy gap of the semiconductor material in which the solar cell is formed, thereby enhancing the efficiency of the solar cell with respect to the amount of the light that is converted.

Heretofore in the art, however, there has not been a series solar cell array wherein a provision was made for the variation in incident light over the surface of the array.

DISCLOSURE OF THE INVENTION

In accordance with the invention, the interposition of a fluorescent material member between the incident concentrated light and a series connected array of solar cells will operate to distribute the light intensity that impinges on the series connected array of solar cells to insure that each member of the cell array receives an equal amount of light.

Best Mode for Carrying out the Invention

Figure 1:
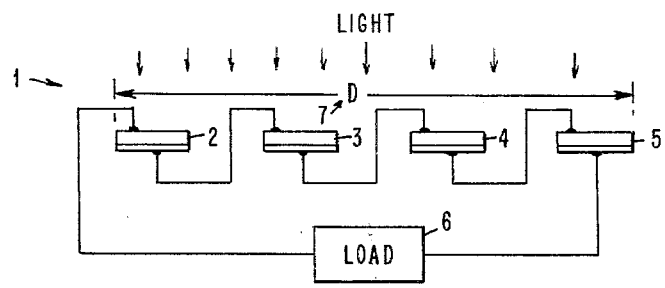
FIG. 1 is a schematic illustration of an array of series solar cells.

Referring to FIG. 1 there is shown a schematic diagram of an array of solar cells 1 having cells 2, 3, 4 and 5 series connected across a load 6. The area of the array though having two dimensions is shown as a single dimension 7 labelled D. The array is designed such that the individual voltages from the elements 2 through 5 as a result of the light that strikes their surfaces is additive across the load 6. Such a structure, however, has the limitation that the total current flowing through the load 6 is limited by the maximum current that is delivered by the weakest of the cells and consequently it is important that an equal proportion of the light strikes each cell.

Figure 2:
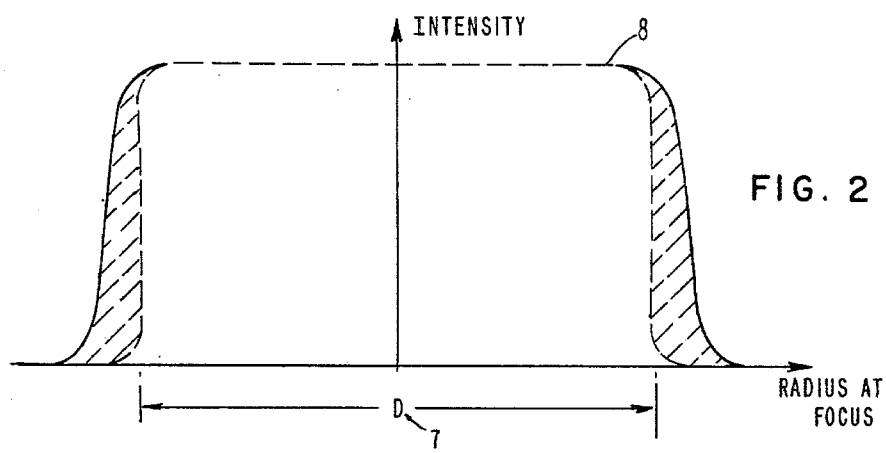
FIG. 2 is a graph which indicates the variation in intensity of light with radius at the point of focus.

Referring next to FIG. 2, a curve 8 is provided showing the intensity of light as a function of the position on the array for the present designs of light concentrating devices wherein the dimension 7 is shown as D and a shaded area is shown which is about 20% of the the total wherein the light is in effect lost.

In order to make this shaded area as small as possible, very special lens designs must be made. Also, errors in tracking the movement of the sun can have drastic consequences if the end cells of the array become partially unilluminated by a shift in the center of the intensity curve of FIG. 2 away from the center of the array.

Figure 3:
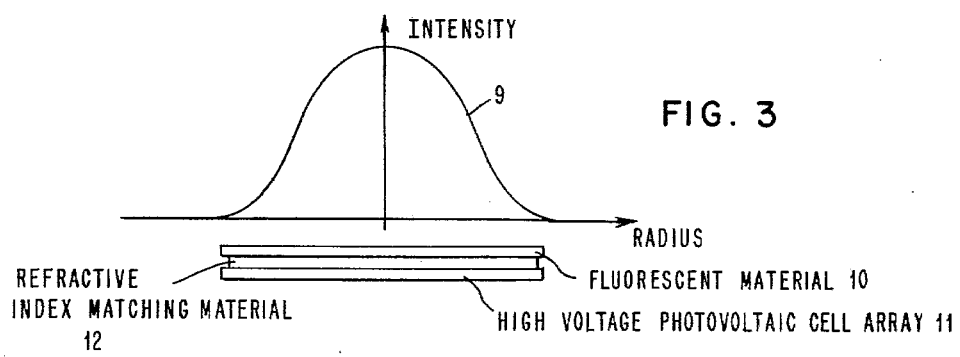
FIG. 3 is a combination of a graph and a schematic of a high voltage photo cell with a fluorescent material cover of the invention interposed under a graph showing a relationship of light intensity with radius.

Referring next to FIG. 3, curve 9 is shown which represents the intensity of the light as a function of position of a more typical light concentration system which uses simple optics and less stringent alignment and suntracking conditions. Also shown is a fluorescent member 10 of the invention associated with a high voltage series connected photovoltaic cell array 11 of the type shown in FIG. 1. The fluorescent member transmits the long wavelength portions of the incident light 9 directly to the solar cell array and absorbs the shorter wavelength portion of the incident light. The absorbed light energy is then re-emitted as longer wavelength light by the member 10 and nearly all of this re-emitted light finds its way into the array 11. If a refractive index matching optical coupling material 12 with uniform refractive index as a function of position is used, the fluorescent portion of the light will be distributed uniformly across the array 11 since the re-emitted light makes several internal reflections on the average before entering the array. The combination of transmitted plus re-emitted light entering the array will be more uniform than the incident intensity 9.

However, if the index matching material 12 has a nonuniform refractive index such that the index is low at the center and increases with position away from the center, then the re-emitted fluorescent light is distributed more intensely at the edges and less intensely in the middle.

Figure 4:
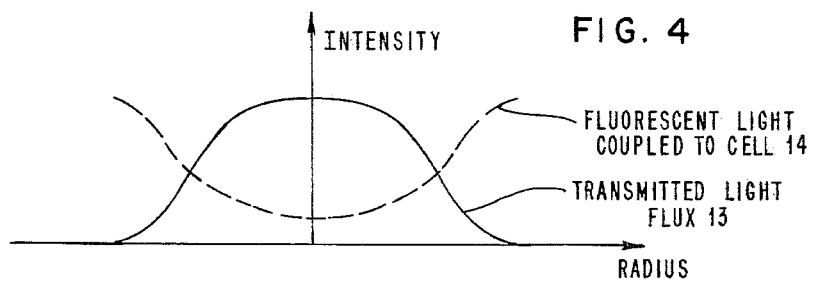
FIG. 4 is a graph of light intensity with radius showing the result of the conversion of light involving the fluorescent material.

Referring to FIG. 4, a sketch is shown of the directly transmitted light flux 13 and the re-emitted light flux 14 converted by the fluorescent material 10. The sum of the two light fluxes is now uniform over the area of the cell array 11.

In order to enable one skilled in the art to practise the invention the following set of specifications are set forth:

Referring to FIG. 1, each solar cell may be made of silicon such that an array of N cells where N is any number, for example 4 to 120, placed in series across a load 6 would provide an output of about 0.5 N volts. Alternately each cell could be made of gallium arsenide such that an array of N cells placed in series across a load 6 would provide an output of about N volts. Gallium arsenide cells may be positioned on an insulating gallium arsenide substrate. Focusing lenses usable with the array are typically 6 to 18 inches in width and length and the cell array 1 may have a typical dimension 7 of 0.5 to 2 inches.

In accordance with the invention, the use of a fluorescent member 10 of chromium-doped aluminum oxide (ruby) or rare-earth doped glass together with index matching materials such as silicone-based adhesives would operate in accordance with FIG. 4 to convert the incident light as shown on the dotted line. The chromium or rare-earth concentrations in these members 10 are typically in the range of 0.1% to 10%.

What has been described is the use of a layer of fluorescent material over a series array of solar cells to convert incident light to a uniform number of photons per cell.

Having described the invention, what is claimed as new and what is desired to secure by Letters Patent is:

1. A solar cell array comprising in combination:
   a plurality of individual solar cell elements arranged in an area that is essentially evenly distributed around a point of maximum intensity of a source of concentrated light adapted to impinge on said area;
   means connecting said solar cell elements in at least one path between external electrodes, said path containing a number of said elements connected in series; and
   a light distribution member positioned between said source of concentrated light and said area containing said plurality of solar cells, said light distribution member containing a fluorescent material and further comprising optical coupling means interposed between said light distribution member and said solar cell elements, said optical coupling means comprising a refractive index matching material having a nonuniform refractive index such that said index is low at the center of said optical coupling means and increases with position away from said center, whereby localized regions of high intensity light from said source of concentrated light are converted to a uniform intensity light flux over said area.

2. The array of claim 1 wherein said flourescent material is aluminum oxide doped with 0.1% to 10% chromium ions.

3. The solar array of claim 2 wherein said solar cell elements comprise silicon solar cells.

4. The solar array of claim 2 wherein said solar cell elements comprise gallium arsenide solar cells.

* * * * *